(12) United States Patent
Nakase et al.

(10) Patent No.: US 6,998,668 B2
(45) Date of Patent: Feb. 14, 2006

(54) SEMICONDUCTOR INTEGRATED CIRCUIT DEVICE INCLUDING A LEVEL SHIFTER

(75) Inventors: Yasunobu Nakase, Tokyo (JP); Hiromi Notani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 392 days.

(21) Appl. No.: 10/246,654

(22) Filed: Sep. 19, 2002

(65) Prior Publication Data

US 2003/0173644 A1    Sep. 18, 2003

(30) Foreign Application Priority Data

Mar. 18, 2002    (JP)    ............... P2002-073836

(51) Int. Cl.
*H01L 29/94*    (2006.01)

(52) U.S. Cl. .................... 257/312; 257/296
(58) Field of Classification Search ............. 326/62, 326/63, 64, 65, 66, 67, 68, 69, 70, 71, 72, 326/73, 74, 75, 76, 77, 78, 79, 80, 81, 82, 326/83, 84, 85, 86, 87, 88, 90, 91, 92; 257/288, 257/296, 300, 312, 313

See application file for complete search history.

(56) References Cited

U.S. PATENT DOCUMENTS 4,791,463 A * 12/1988 Malhi
5,528,172 A * 6/1996 Sundstrom
5,818,258 A * 10/1998 Choi
6,621,128 B1 * 9/2003 Lee et al.

FOREIGN PATENT DOCUMENTS

JP    2000-228627    8/2000
JP    2000-228628    8/2000

* cited by examiner

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

A semiconductor integrated circuit device is provided, in which a node from which an output signal of a level shifter is sent can be initialized such that the potential thereof be set at a desired logic level at the time of power supply.

The semiconductor integrated circuit device includes a level shifter 6 and two capacitors N10 and C0. The level shifter 6 receives an input signal and converts the received signal to a signal having a voltage amplitude greater than that of the received signal, then to provide the signal to a node D3. The capacitor N10 is connected to the node D3, and the capacitor C0 is connected in series with the capacitor N10. The capacitor N10 is formed of a MOS transistor having a gate connected to the node D3 and a source and a drain both connected to the capacitor C0.

17 Claims, 7 Drawing Sheets

SEMICONDUCTOR INTEGRATED CIRCUIT DEVICE INCLUDING A LEVEL SHIFTER

BACKGROUND OF THE INVENTION

1. Field of the Invention

The present invention relates to a semiconductor integrated circuit device including a level shifter for converting a signal as inputted to a signal having a greater voltage amplitude.

2. Description of the Background Art

As a result of the recent development in technologies for finer semiconductor processing, the number of transistors that can be integrated on a single chip in a semiconductor integrated circuit device has drastically increased, which in turn causes increase of power consumption. In order to reduce power consumption, it is requisite to reduce a power supply voltage. To take a MOS (metal oxide semiconductor) transistor as an example, which is one of the most prevailing field effect transistors in the recent days, the minimum design rule thereof has decreased from 0.25 $\mu$m to 0.18 $\mu$m, and further decreased from 0.18 $\mu$m to 0.15 $\mu$m up to these days, which has been followed by decrease of a power supply voltage from 2.5V to 1.5V via 1.8V. Since such power supply voltage as decreased is utilized for a core portion in an integrated circuit, it will be hereinafter referred to as a power supply voltage VDD of a core circuit in the following description.

On the other hand, an interface portion provided for exchanging signals with another chip is supplied with another power supply voltage VDDH having a constant value which is kept higher than the power supply voltage VDD of the core circuit, notwithstanding the development in the techniques for semiconductor processing. Recently, a 3.3V-voltage is used as the power supply voltage VDDH in most cases. The reasons for using the power supply voltage VDDH for the interface portion are that: all transistors on each chip mounted on a board are not manufactured using the most advanced technologies for semiconductor processing; and a change in standards for the interface portion probably causes considerable confusion. However, it is impossible to have a transistor(s) in the core portion which is manufactured using the most advanced technologies operate with a 3.3V-power supply voltage. In this regard, as for a transistor(s) in the interface portion, the film thickness of a gate oxide film thereof is increased to increase a breakdown voltage of a gate thereof, as compared with that in the core portion, while permitting performance of the device to be degraded due to the increase in film thickness of the gate oxide film.

To use more than two kinds of power supply voltages in one integrated circuit device for the reasons noted above would require a level shifter for changing an amplitude of a signal between circuit blocks different from each other in power supply voltage used therein.

FIG. 11 shows a conventional semiconductor integrated circuit device including a level shifter. A signal Din is a digital signal generated within a core circuit 2, high and low levels of which signal are equal to a level of the power supply voltage VDD and a level of a ground voltage GND, respectively. The core circuit 2 generates two pairs of logically complementary signals based on the signal Din through logic gates IN0, IN1, IN2, G0 and G1. Each of the signals to be generated has a voltage amplitude identical to that of the signal Din. A level shifter 16 receives one of the pairs of complementary signals at gate electrodes of NMOS transistors N0 and N1, while a level shifter 18 receives the other pair of complementary signals at gate electrodes of NMOS transistors N2 and N3.

One logic is inputted to each gate of the NMOS transistors N0 and N2 and another logic reverse to the one logic is inputted to each of the NMOS transistors N1 and N3. Accordingly, the level shifters 16 and 18 output signals which have the same logic and swing between levels of the power supply voltage VDDH and the ground voltage GND, from nodes D1 and D2, respectively. In accordance with the signals outputted from the level shifters 16 and 18, a PMOS transistor PD and an NMOS transistor ND of a driver portion 10 are turned ON in a complementary manner.

When an enable signal EN represents a high logic level, a signal Dout having the same logic as that of the signal Din and having a greater amplitude than that of the signal Din is present on a node 23 with the foregoing operations having been followed. When the enable signal EN represents a low logic level, the PMOS transistor PD and the NMOS transistor ND of the driver portion 10 are simultaneously turned OFF, so that the node 23 is put in a high-impedance state.

As described above, when more than two kinds of power supply voltages are used in a semiconductor integrated circuit device, the PMOS transistor PD and the NMOS transistor ND may possibly be simultaneously turned ON at the time of power supply, depending on which portion of the device is supplied with power earlier. For the supply of power, a power supply voltage is applied to an external power source terminal of the semiconductor integrated circuit device, so that the potential of a power node within the device is raised from the level of the ground voltage to the level of the power supply voltage.

In an situation where the power supply voltage VDDH is applied to an interface portion 4 after the power supply voltage VDD is applied to the core circuit 2, no problem would arise. In that situation, the logic levels of the two pairs of signals to be sent from the core circuit 2 to the interface portion 4 are determined prior to application of the power supply voltage to the interface portion 4. Hence, there is no possibility that the PMOS and NMOS transistors PD and ND are simultaneously turned ON. Accordingly, no current flowing through the transistors PD and ND is caused. However, in an situation contrary to the foregoing case, where the power supply voltage VDD is applied to the core circuit 2 after the power supply voltage VDDH is applied to the interface portion 4, a problem will arise as below.

At the time when the power supply voltage VDDH is applied to the interface portion 4, each potential of the gate electrodes of the NMOS transistors N0 and N1 of the level shifter 16 is kept at a low logic level (i.e., the level of GND). Accordingly, a potential of the node D1 as an output terminal is indefinite and may possibly be set at a low logic level (i.e., the level of GND), for example. Likewise, since each potential of the gate electrodes of the NMOS transistors N2 and N3 of the level shifter 18 is kept at a low logic level at the time of power supply, a potential of the node D2 as an output terminal is indefinite and may possibly be set at a high logic level (i.e., the level of VDDH), for example. With the potentials of the nodes D1 and D2 being set as such, the PMOS transistor PD and the NMOS transistor ND are simultaneously turned and kept ON until levels of signals to be respectively inputted from the level shifters 16 and 18 are determined. Each of the transistors PD and ND functioning as an output driver is configured so as to have a grater driving force than that of any other transistor having a different function. For this reason, when the PMOS transistor PD and the NMOS transistor ND are simultaneously turned ON, it results in generation of a large amount of current flow. The large amount of current flow is likely to cause wire-disconnection or the like, leading to destruction of the semiconductor device.

SUMMARY OF THE INVENTION

It is an object of this invention to provide a semiconductor integrated circuit device which allows a potential of a node to which a signal as level-shifted by a level shifter is provided to be set at a desired logic level at the time of power supply.

It is a different object of this invention to provide a semiconductor integrated circuit device which can operate at a high speed during a normal operation after the time of power supply.

It is another different object of this invention to provide a semiconductor integrated circuit device which allows a circuit connected to an output of a level shifter to stably operate at the time of power supply.

According to a first aspect of the present invention, a semiconductor integrated circuit device includes a level shifter, a first capacitor and a second capacitor. The level shifter is connected to a power node supplied with a power supply voltage and to a ground node supplied with a ground voltage. The level shifter receives a signal and converts the signal to a different signal having a voltage amplitude greater than that of the signal, to output the different signal to a first node. The first capacitor includes: a conductive portion electrically connected with the first node; a first semiconductor portion with an insulating film interposed between the conductive portion and the first semiconductor portion; and a second semiconductor portion having a conductivity type different from that of the first semiconductor portion and placed adjacent to the first semiconductor portion. The second capacitor is connected in series with the second semiconductor portion of the first capacitor at a second node separated from each of the power node and the ground node.

At the time of power supply, the potential of the first node is set at the potential of the first semiconductor portion due to the capacitance between the conductive portion and the first semiconductor portion in the first capacitor. After the power supply, when the capacitance between the conductive portion and the second semiconductor portion of the first capacitor contributes to a capacitance to be provided to the first node, the capacitance to be provided to the first node is apparently reduced due to the second capacitor connected in series with the second semiconductor portion. This apparent reduction in the capacitance to be provided to the first node increases the operation speed of the level shifter during a normal operation after the power supply. Accordingly, the semiconductor integrated circuit device can operate at a high operation speed.

According to a second aspect of the present invention, a semiconductor integrated circuit device includes a core circuit, a level shifter and a capacitor. The core circuit is connected to a ground node supplied with a ground voltage and to a first power node supplied with a power supply voltage, and generates a first signal having a given voltage amplitude. The level shifter is connected to the ground node and to a second power node supplied with a different power supply voltage. The level shifter receives the first signal and converts the first signal to a second signal having a voltage amplitude greater than that of the first signal, to provide the second signal to a predetermined node. The capacitor includes: a conductive portion electrically connected to the predetermined node; a first semiconductor portion with an insulating film interposed between the first semiconductor portion and the conductive portion; and a second semiconductor portion which has a conductivity type different from that of the first semiconductor portion, is placed adjacent to the first semiconductor portion, and is electrically connected to the first power node.

At the time of power supply, the potential of the first node is set at the potential of the first semiconductor portion due to the capacitance between the conductive portion and the first semiconductor portion of the capacitor. Also, the second semiconductor portion is connected to the power node supplied with a power supply voltage serving as power for the core circuit. As a result, it is possible to apply a reverse bias voltage across the first and second semiconductor portions after the power supply. This reduces the capacitance between the conductive portion and the first semiconductor portion. Thus, during a normal operation after the power supply, the capacitance to be provided to the predetermined node is reduced, which allows for increase of the operation speed of the level shifter. Accordingly, the semiconductor integrated circuit device can operate at a high operation speed.

According to a third aspect of the present invention, a semiconductor integrated circuit device includes a level shifter, a capacitor and a switching element. The level shifter receives a signal and converts the signal to a different signal having a voltage amplitude greater than that of the signal, to provide the different signal to a first node. The capacitor includes a first electrode supplied with a given voltage and a second electrode connected to a second node. The switching element is connected between the first and second nodes, for controlling conduction between the first and second nodes.

By controlling the switching element, it is possible to make the capacitance of the capacitor apparently variable relative to the second node. At the time of power supply, by turning the switching element ON, it is possible to set the potential of the second node at the level of a voltage applied to the first electrode of the capacitor.

Further, during a normal operation after the power supply, by turning the switching element OFF and weakening the ON-state of the device as compared at the time of the power supply, the capacitor is separated from the second node, or a dummy resistance is provided between the capacitor and the second node. This results in reduction in the capacitance to be provided to the second node during a normal operation, thereby to increase the operation speed of the level shifter. Accordingly, the semiconductor integrated circuit device can operate at a high operation speed.

According to a fourth aspect of the present invention, a semiconductor integrated circuit device includes a level shifter, a capacitor and at least one field effect transistor. The level shifter is connected to a first node supplied with a first voltage and to a second node supplied with a second voltage. The level shifter receives two input signals logically complimentary to each other and converts the two input signals to two different signals logically complimentary to each other and greater than the two input signals in voltage amplitude thereof, to provide the two different signals to third and fourth nodes, respectively. The capacitor is connected between the first and third nodes. The at least one field effect transistor is electrically connected between the first and second nodes and has a gate electrically connected to one of the third and fourth nodes. No capacitor for creating a capacitance between the second and fourth nodes is provided.

Because of the above noted structure of the level shifter in which two logically complimentary signals are received and converted to different two logically complimentary signals, it is possible to set the potential of the fourth node at a logic level reverse to a logic level for the third node at the time of power supply without providing a capacitor between the second and fourth nodes. Accordingly, during a normal operation after the power supply, the level shifter can operate all the more quickly because a capacitor for setting the potential of the second node at a predetermined logic level at the time of power supply is not provided. As a result, the semiconductor integrated circuit device can operate at a high operation speed.

According to a fifth aspect of the present invention, a semiconductor integrated circuit includes first and second level shifters, first and second capacitors and first and second field effect transistors. The first level shifter receives two first signals logically complimentary to each other and converts the two first signals to two different signals greater than the two first signals in voltage amplitude, to provide the two different signals to first and second nodes, respectively. The second level shifter receives two second signals logically complimentary to each other and converts the two second signals to two another different signals greater than the two second signals in voltage amplitude thereof, to provide the two another different signals to third and fourth nodes, respectively. The first capacitor is connected between a fifth node supplied with a given voltage and the first node. The second capacitor is connected between the third and fifth nodes. The conduction in the first field effect transistor is controlled in accordance with a third signal on the second node. The conduction in the second field effect transistor is controlled in accordance with a fourth signal on the fourth node, The second field effect transistor is connected to the first field effect transistor and has a conductivity type different from that of the first field effect transistor.

At the time of power supply, each potential of the first and third nodes is set at a predetermined logic level as an initial logic level, so that the first and second level shifters drive the second and fourth nodes and set the potentials of the first and third nodes at respective logic levels reverse to each other . The potential of each of the second and fourth nodes is more stable than the potential of each of the first and third nodes which is determined by the capacitor. By obtaining signals for driving the first and second field effect transistors from the second and fourth nodes, it is possible to properly turn the first and second field effect transistors ON or OFF at the time of power supply. As a result, the state of a circuit formed by the first and second field effect transistors is stable.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiments

Figure 1:
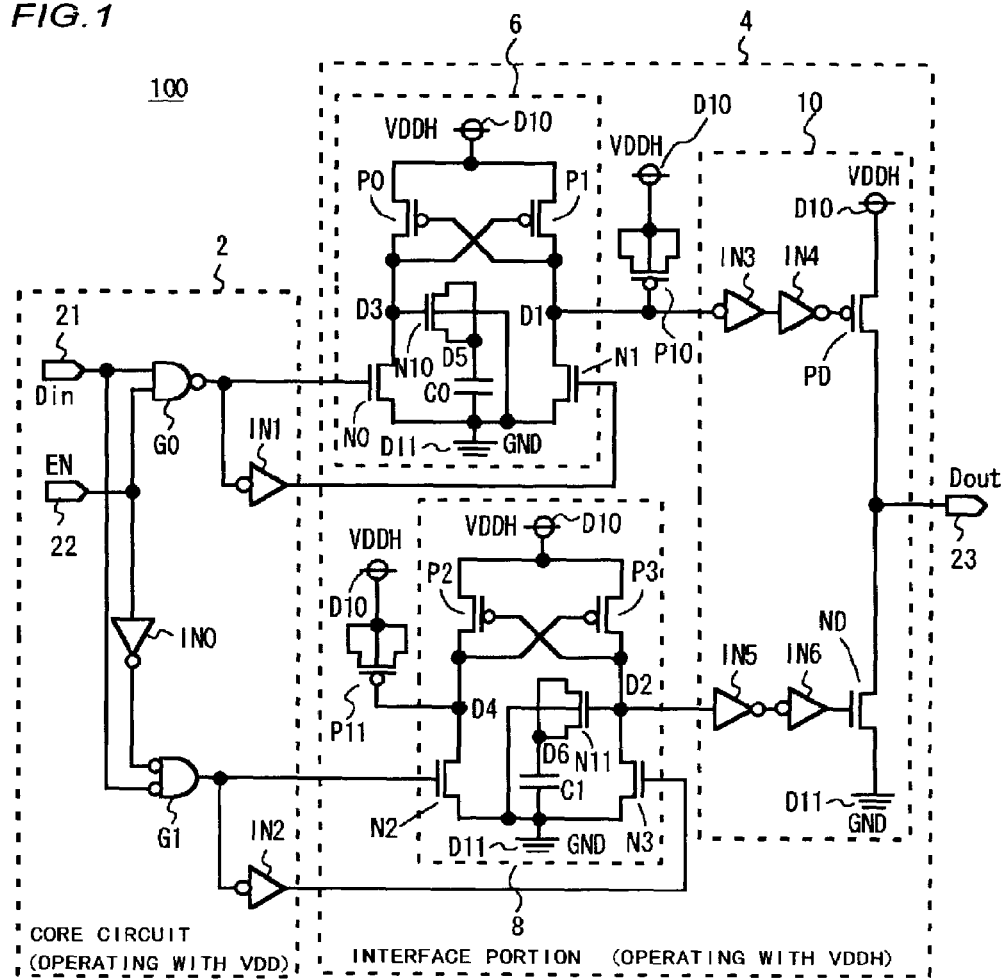
FIG. 1 is a circuit diagram showing a semiconductor integrated circuit device 100 according to a first preferred embodiment of the present invention.

Below, preferred embodiments of the present invention will be discussed with reference to the accompanying drawings. It is noted that elements identical or similar to each other are denoted by the same reference character/numeral in the drawings.

<First Preferred Embodiment>

FIG. 1 is a circuit diagram showing a structure of a semiconductor integrated circuit device 100 according to a first preferred embodiment of the present invention. The semiconductor integrated circuit device 100 with a single semiconductor chip on which an integrated circuit is formed includes a core circuit 2 for implementing a primary function of the integrated circuit and an interface portion 4 for converting a digital signal Din generated in the core circuit 2 to a digital signal having a greater voltage amplitude than that of the signal Din, to provide the digital signal as a signal Dout to another semiconductor chip which is connected with a node 23.

The core circuit 2 is connected to a power node to which a power supply voltage VDD is applied, and is further connected to a ground node to which a ground voltage GND (0V) is applied. The core circuit 2 operates using the power supply voltage VDD as an operating power, while the interface portion 4 operates using a power supply voltage VDDH higher than the power supply voltage VDD, as an operating power. The ground voltage GND is applied to each of the core circuit 2 and the interface portion 4. Hence, a MOS transistor(s) forming the interface portion 4 is configured so as to have an increased breakdown voltage of a gate thereof by increasing the film thickness of a gate oxide film, for example, as compared with a MOS transistor(s) forming the core circuit 2.

Each of the power supply voltages VDD and VDDH may be generated outside a semiconductor chip, to be received by the chip. Alternatively, only one of the power supply voltages VDD and VDDH may be generated outside the semiconductor chip, in which case a voltage generating circuit is provided within the chip for receiving the one of the voltages VDD and VDDH generated outside the chip and generating the other of the voltages VDD and VDDH based on the one of the voltages VDD and VDDH generated outside the chip.

In the semiconductor integrated circuit device 100, when the enable signal EN represents a high logic level (VDD), the voltage amplitude of the signal Din is increased and the signal with the increased voltage amplitude is outputted from the node 23. When the enable signal EN represents a low logic level (GND), the node 23 is put in a high-impedance state.

To implement the foregoing operations, the core circuit 2 includes inverters IN0, IN1 and IN2, and two-input logic circuits G0 and G1. The logic circuit G0 receives the signal Din present on a node 21 and the enable signal EN present on a node 22, and outputs a logic obtained by performing a NAND operation on the received signals. The inverter IN1 inverts the logic outputted from the logic circuit G0, while the inverter IN0 inverts the logic represented by the enable signal EN. The logic circuit G1 outputs a logic obtained by performing a NOR operation on the signal Din and an output from the inverter IN0. The inverter IN2 inverts the logic outputted from the logic circuit G1. Each output from the inverters IN0 to IN2 and the logic circuits G0 and G1 is a digital signal, high and low logic levels of which are equal to the levels of the power supply voltage VDD and the ground voltage GND, respectively.

When the enable signal EN represents a high logic level, the logic circuit G0 outputs an inverse of the logic of the signal Din, while the inverter IN1 outputs the same logic as that of the signal Din. The logic circuit G1 outputs an inverse of the logic of the signal Din, while the inverter IN2 outputs the same logic as that of the signal Din. On the other hand, when the enable signal EN represents a low logic level, the logic circuit G0 and the inverter IN1 output a high logic level signal and a low logic level signal, respectively, and the logic circuit G1 and the inverter IN2 output a low logic level signal and a high logic level signal, respectively, irrespective of the logic of the signal Din.

The interface portion 4 includes two level shifters 6 and 8, and a driver portion 10. Each of the level shifters 6 and 8 is connected to a power node D10 to which the power supply voltage VDDH is applied and is further connected to a ground node D11 to which the ground voltage GND is applied, and functions to convert a signal as inputted to a signal having a greater voltage amplitude than that of the signal as inputted. The present preferred embodiment employs a level shifter of a type which is configured so as to receive two logically complementary signals and to provide another two logically complementary signals which have greater voltage amplitudes than those of the two signals as received, to two predetermined nodes, respectively.

The level shifter 6 includes PMOS transistors P0 and P1 and NMOS transistors N0 and N1. Each of the PMOS transistors P0 and P1 has a source connected to the power node D10 and supplied with the power supply voltage VDDH. A drain of the PMOS transistor P0 and a gate of the PMOS transistor P1 are connected to each other at a node D3. A drain of the PMOS transistor P1 and a gate of the PMOS transistor P0 are connected to each other at a node D1. Each of the NMOS transistors N0 and N1 has a source connected to the ground node D11 and supplied with the ground voltage GND. Drains of the NMOS transistors N0 and N1 are connected to drains of the PMOS transistors P0 and P1 at the nodes D3 and D1, respectively.

The level shifter 6 receives two logically complementary signals each swinging between the power supply voltage VDD level and the ground voltage GND level, at the gates of the NMOS transistors N0 and N1, respectively. Upon application of a high logic level signal and a low logic level signal to the gates of the transistors N0 and N1, respectively, the NMOS transistor N0 is turned ON while the NMOS transistor N1 is turned OFF. The potential of the node D3 is lowered to turn the PMOS transistor P1 ON. On the other hand, the potential of the node D1 is raised to turn the PMOS transistor P0 OFF. As a result, the potentials of the nodes D1 and D3 become equal to the levels of the power supply voltage VDDH and the ground voltage GND, respectively.

Conversely, upon application of a low logic level signal and a high logic level signal to the gates of the transistors N0 and N1, respectively, the NMOS transistor N1 is turned ON and the NMOS transistor N0 is turned OFF. The potential of the node D1 is lowered to turn the PMOS transistor P0 ON, while the potential of the node D3 is raised to turn the PMOS transistor P1 OFF. As a result, the potentials of the nodes D1 and D3 become equal to the levels of the ground voltage GND and the power supply voltage VDDH, respectively.

The level shifter 8 includes PMOS transistors P2 and P3 and NMOS transistors N2 and N3. Each of the PMOS transistors P2 and P3 has a source connected to the power node D10 and supplied with the power supply voltage VDDH. A drain of the PMOS transistor P2 and a gate of the PMOS transistor P3 are connected to each other at a node D4. A drain of the PMOS transistor P3 and a gate of the PMOS transistor P2 are connected to each other at a node D2. Each of the NMOS transistors N2 and N3 has a source connected to the ground node D11 and supplied with the ground voltage GND. Drains of the NMOS transistors N2 and N3 are connected to drains of the PMOS transistors P2 and P3 at the nodes D4 and D2, respectively.

The level shifter 8 receives two logically complementary signals, each swinging between the power supply voltage VDD level and the ground voltage GND level, at the gates of the NMOS transistors N2 and N3, respectively. In the same manner as in the level shifter 6, application of a high logic level signal and a low logic level signal to the gates of the NMOS transistors N2 and N3, respectively, makes the potentials of the nodes D4 and D2 equal to the levels of the ground voltage GND and the power supply voltage VDDH, respectively. On the other hand, application of a low logic level signal and a high logic level signal to the gates of the NMOS transistors N2 and N3, respectively, makes the potentials of the nodes D4 and D2 equal to the levels of the power supply voltage VDDH and the ground voltage GND, respectively.

For the logically complementary signals to be provided to the level shifters 6 and 8, the outputs of the logic circuit G0 and the inverter IN1 are provided to the gates of the NMOS transistors N0 and N1, respectively, while the outputs of the logic circuit G1 and the inverter IN2 are provided to the gates of the NMOS transistors N2 and N3, respectively. The voltage VDD provided as a high logic level signal to the gates of the NMOS transistors N0 to N3 is higher in level than a threshold voltage Vthn, and thus is sufficient for turning those NMOS transistors ON. Therefore, any one of the PMOS transistors P0 to P3 which is connected to the drain of any one of the NMOS transistors being turned ON has its gate supplied with the ground voltage GND, to be driven.

The driver portion 10 includes inverters IN3 to IN6, a PMOS transistor PD and an NMOS transistor ND. The level shifter 6 is provided in order to control the ON/OFF state of the PMOS transistor PD, and the node D1 is connected to a gate of the PMOS transistor PD via the inverters IN3 and IN4 connected in series with each other. The level shifter 8 is provided in order to control the ON/OFF state of the NMOS transistor ND, and the node D2 is connected to a gate of the NMOS transistor ND via the inverters IN5 and IN6 connected in series with each other. Each of the inverters IN3 to IN6 operates upon application of the power supply voltage VDDH and the ground voltage GND thereto. Accordingly, a high logic level of an output from each of the inverters corresponds to the power supply voltage VDDH level, and a low logic level thereof corresponds to the ground voltage GND level.

The PMOS transistor PD and the NMOS transistor ND have sources connected to the power node D10 and the ground node D11, respectively, which are supplied with the power supply voltage VDDH and the ground voltage GND, respectively. Drains of the PMOS and NMOS transistors PD and ND are connected to each other at a node 23 from which the signal Dout is obtained. When the potential of the node D1 is set at a high logic level, the PMOS transistor PD is turned OFF, while when the potential of the node D1 is set at a low logic level, the PMOS transistor PD is turned ON. When the potential of the node D2 is set at a low logic level, the NMOS transistor ND is turned OFF, while when the potential of the node D2 is set at a high logic level, the NMOS transistor ND is turned ON. Each of the MOS transistors PD and ND function as drive transistors for transmitting a signal to another semiconductor chip, and thus has a greater current-driving capability than that of any other transistor forming the interface portion 4.

With the foregoing structure given, when the enable signal EN represents a high logic level, a logic reverse to the logic of the signal Din is outputted from the node D1, and a logic reverse to the logic of the signal Din is outputted from the node D2. Accordingly, when the signal Din is at a high logic level, the PMOS transistor PD is turned ON and the NMOS transistor ND is turned OFF, so that the signal Dout is at a high logic level equal to the level of the power supply voltage VDDH. On the other hand, when the signal Din is at the low logic level, the PMOS transistor PD is turned OFF and the NMOS transistor ND is turned ON, so that the signal Dout is at a low logic level equal to the level of the ground voltage GND. When the enable signal EN represents a low logic level, the potentials of the nodes D1 and D2 are set at a high logic level and a low logic level, respectively, irrespective of the level of the signal Din, so that both the PMOS and NMOS transistors PD and ND are turned OFF.

The semiconductor integrated circuit device 100 further includes PMOS transistors P10 and P11, NMOS transistors N10 and N11, and capacitors C0 and C1. The PMOS transistor P10 functions as a capacitor connected between the nodes D1 and D10, for setting the potential of the node D1 at a high logic level at the time of supplying power to the interface portion 4. The PMOS transistor P10 has a gate connected to the node D1, and a source and a drain each connected to the power node D10.

The NMOS transistor N10 functions as a capacitor connected between the node D3 and D11, for setting the potential of the node D3 at a low logic level at the time of supplying power to the interface portion 4. The NMOS transistor N10 has a gate connected to the node D3, and a source and a drain each connected to a node D5. The capacitor C0 is provided in order to reduce a capacitance between the node D3 and the ground node D11 during a normal operation occurring after the time of supplying power to the interface portion 4. One of a pair of electrodes of the capacitor C0 is the node D5 which is connected to the source and the drain of the NMOS transistor N10, while the other electrode is connected to the ground node D11.

The PMOS transistor P11 functions as a capacitor connected between the nodes D4 and D10, for setting the potential of the node D4 at a high logic level at the time of supplying power to the interface portion 4. The PMOS transistor P11 has a gate connected to the node D4, and a source and a drain each connected to the power node D10.

The NMOS transistor N11 functions as a capacitor connected between the node D2 and D11, for setting the potential of the node D2 at a low logic level at the time of supplying power to the interface portion 4. The NMOS transistor N11 has a gate connected to the node D2, and a source and a drain each connected to a node D6. The capacitor C1 is provided in order to reduce a capacitance between the node D2 and the ground node D11 during a normal operation occurring after the time of supplying power to the interface portion 4. One of a pair of electrodes of the capacitor C1 is the node D6 which is connected to the source and the drain of the NMOS transistor N11, while the other electrode is connected to the ground node D11.

Each of the nodes D5 and D6 is separated from the power node D10, as well as the ground node D11, to be so-called floating. Further, each of the NMOS transistors N0 to N3, N10 and N11 has a back gate (substrate) which is connected to the ground node D11 and is supplied with the ground voltage GND, while each of the PMOS transistors P0 to P3, P10 and P11 has a back gate (substrate) which is connected to the power node D10 and is supplied with the power supply voltage VDDH, though only a part of the foregoing configuration is shown in FIG. 1.

Figure 2:
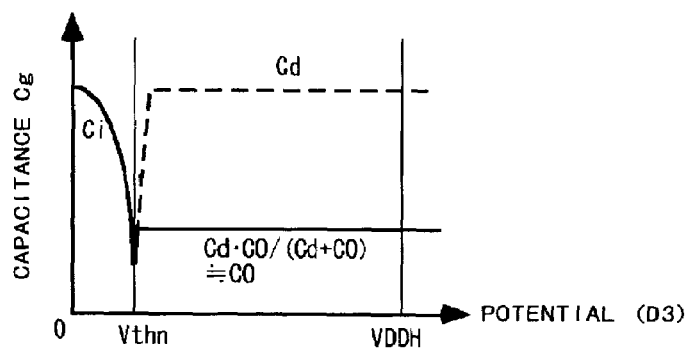
FIG. 2 is a graph illustrating the characteristics of a capacitance of a capacitor connected to a node, a potential of which is set at a predetermined logic level at the time of power supply in a level shifter shown in FIG. 1.

FIG. 2 is a graph showing a relationship between the potential of the node D3 and a capacitance Cg between the nodes D3 and D11 which is obtained by the NMOS transistor N10 and the capacitor C0. As appreciated therefrom, the capacitance Cg between the nodes D3 and D11 corresponds to a gate-substrate capacitance Ci of the NMOS transistor N10 until the potential of the node D3 exceeds the level of the threshold voltage Vthn (approximately 0.8V) of the NMOS transistor N10. The capacitance Ci decreases as the potential of the node D3 increases, because a depletion layer extends through the substrate under the gate of the NMOS transistor N10.

After the potential of the node D3 exceeds the level of the threshold voltage Vthn, a channel is formed under the gate of the NMOS transistor N10. As a result, the capacitance Cg no longer corresponds to the capacitance Ci, and instead corresponds to a composite capacitance of a gate-source/drain capacitance Cd of the NMOS transistor N10 and a capacitance C0 of the capacitor C0. The composite capacitance, expressed by Cd·C0/(Cd+C0), is obtained by connecting the NMOS transistor N10 and the capacitor C0 in series with each other. In the present preferred embodiment, since it is predetermined as Cd>>C0, the capacitance Cg can be regarded as being substantially identical to the capacitance C0. A relationship between the potential of the node D2 and a capacitance (also denoted by "Cg") between the node D2 and the ground node D11 which is obtained by the NMOS transistor N11 and the capacitor C1 is similar to that shown in FIG. 2, and thus detailed discussion thereabout is omitted.

Next, operations of the NMOS transistors N10 and N11, the PMOS transistors P10 and P11, and the capacitors C0 and C1 at the time of power supply will be described. Each potential of the gates of the NMOS transistors N0 to N3, as well as the sources and drains of the NMOS transistors N10 and N11 is kept at the level of the ground voltage GND prior to supplying power to the core circuit 2 and the interface portion 4.

First, the operations of the transistors and the capacitors in a situation where power is supplied to the interface portion 4 earlier than the core circuit 2. In the course of rising of the potential of the power node D10 to the power supply voltage VDDH level in the level shifter 6, an electric charge injected into the node D3 is used for charging the capacitance Cg between the node D3 and the ground node D11, so that a raise in the potential of the node D3 is prevented. On the other hand, the potential of the node D1 is raised due to the capacitance of the PMOS transistor P10, which is caused by a raise from 0V in the potential of the node D10. Thus, the potential of the node D3 is lower than the potential of the node D1 due to the capacitances of the transistors P10 and N10. Then, such potential difference between the nodes D1 and D3 functions to turn the PMOS transistor P0 OFF, while turning the PMOS transistor P1 ON. The foregoing operation modes of the PMOS transistors further widens the potential difference between the nodes D1 and D3. As a result, the potentials of the nodes D1 and D3 reach a high logic level corresponding to the level of the power supply voltage VDDH and a low logic level corresponding to the level of the ground voltage GND, respectively.

By simulation or the like, the capacitance Cg is determined so as to keep the potential of the node D3 at the time of power supply equal to or lower than the level of the threshold voltage Vthn of the NMOS transistor N10. Accordingly, the gate-source/drain capacitance Cd of the NMOS transistor N10 at the time of power supply is small. As such, the gate-substrate capacitance Ci of the NMOS transistor N10 mainly contributes to the capacitance Cg at the time of power supply. The capacitance Ci can be determined by controlling the area of the gate of the NMOS transistor N10.

In the course of rising of the potential of the node D10 to the level of the power supply voltage VDDH in the level shifter 8, an electric charge injected into the node D2 is used for charging the capacitance Cg between the node D2 and the ground node D11, so that a raise in the potential of the node D2 is prevented. On the other hand, the potential of the node D4 is raised due to the capacitance of the PMOS transistor P11, which is caused by a raise from 0V in the potential of the node D10. Thus, the potential of the node D2 is lower than the potential of the node D4 due to the capacitances of the transistors P11 and N11. Then, such potential difference between the nodes D2 and D4 functions to turn the PMOS transistor P3 OFF, while turning the PMOS transistor P2 ON. The foregoing operation modes of the PMOS transistors further widens the potential difference between the nodes D2 and D4. As a result, the potentials of the nodes D2 and D4 reach a low logic level corresponding to the level of the ground voltage GND and a high logic level corresponding to the level of the power supply voltage VDDH, respectively.

By simulation or the like, the capacitance Cg is determined so as to keep the potential of the node D2 at the time of power supply equal to or lower than the level of the threshold voltage Vthn of the NMOS transistor N11. Accordingly, the gate-source/drain capacitance Cd of the NMOS transistor N11 at the time of power supply is small. As such, the gate-substrate capacitance Ci of the NMOS transistor N11 mainly contributes to the capacitance Cg at the time of power supply. The capacitance Ci can be determined by controlling the area of the gate of the NMOS transistor N11.

In this manner, the potentials of the nodes D1 and D2 are set at a high logic level and a low logic level, respectively, so that the both the MOS transistors PD and ND are put in an OFF-state. Accordingly, a large amount of current flow through the MOS transistors PD and ND will not occur.

In an alternative situation where power is supplied to the core circuit 2 earlier than the interface portion 4, each potential of the gates of the NMOS transistors N0 to N3 is definitely set at a level which does not allow the transistors PD and ND to be simultaneously turned ON, prior to the time of power supply to the interface portion 4, as is conventionally known. Accordingly, there is no possibility that a problem associated with a large amount of current flow which is likely caused by simultaneously turning the transistors PD and ND ON is arisen.

The operations of the transistors and the capacitors during a normal operation after power is supplied to both the core circuit 2 and the interface portion 4 will be described below. Upon application of a low logic level (GND) signal and a high logic level (VDD) signal to the gates of the NMOS transistors N0 and N1, respectively, in the level shifter 6, the node D3 is compulsorily charged up to a high logic level voltage (VDDH), notwithstanding the capacitance Cg as provided. Also, the node D1 is compulsorily discharged to a low logic level voltage (GND), notwithstanding the capacitance of the PMOS transistor P10 as provided. When a high logic level (VDD) signal and a low logic level (GND) signal are applied to the gates of the NMOS transistors N0 and N1, respectively, the node D3 is discharged to a low logic level voltage (GND) while the node D1 is charge up to a high logic level voltage (VDDH), conversely to the foregoing situation.

When the signal Din transitions from a low logic level to a high logic level, the voltage on the node D3 is changed from 0V to VDDH. However, as appreciated from FIG. 2, the capacitance Cg is small due to existence of the capacitance C0 while the potential of the node D3 is ranging between the level of the threshold voltage Vthn to the level of the power supply voltage VDDH. FIG. 2 further includes a dotted line which indicates an assumed value of the capacitance Cg (hereinafter, referred to as an "assumed capacitance Cg") on the assumption that the capacitor C0 is removed and the source and the drain of the NMOS transistor N10 are connected to the ground node D11. The assumed capacitance Cg is identical to the capacitance Cg while the potential of the node D3 is ranging between the levels of 0V and Vthn. However, after the potential of the node D3 exceeds the Vthn level, the assumed capacitance Cg corresponds to the gate-source/drain capacitance Cd of the NMOS transistor N10. The capacitance Cd is substantially identical in magnitude to the capacitance Ci which is obtained when the potential of the node D3 is 0V level. As a conclusion, in the level shifter 6 shown in FIG. 1 according to the present preferred embodiment, when a voltage equal to, or higher than, the threshold voltage Vthn is applied to the gate of the NMOS transistor N10, the capacitance Cg is reduced as compared with a structure not including the capacitor C0. Thus, an amount of electric charge for charging the node D3 is reduced, thereby shortening the time for charging the node D3. This allows for increase in operation speed of the level shifter 6.

Figure 3:
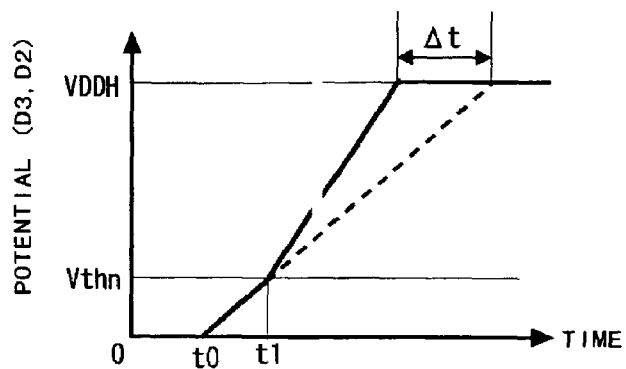
FIG. 3 is a graph illustrating the rising characteristics of the potential of a node to which a capacitor is connected.

FIG. 3 is a graph illustrating level-shifting of the voltage on the node D3 from a low logic level (0V) to a high logic level (VDDH) relative to time. In the graph, a solid line is associated with a structure according to the present preferred embodiment where the capacitor C0 is included, and a dotted line is associated with an assumed structure where the capacitor C0 is removed and the source and the drains of the NMOS transistors N10 are connected to the ground node D11.

In each of the structures including the capacitor C0 and not including the capacitor C0, the potential of the node D3 begins to change at a time t0 and changes in the same manner until a time t1 at which the potential of the node D3 reaches the level of the threshold voltage Vthn. However, after the potential of the node D3 exceeds the threshold voltage Vthn level, the capacitance Cg is reduced more drastically in the structure including the capacitor C0 than in the assumed structure not excluding the capacitor C0. Accordingly, in the structure including the capacitor C0, the change rate of the potential of the node D3 is abruptly increased after the potential of the node D3 exceeds the threshold voltage Vthn level. As shown in FIG. 3, the period of time required for raising the voltage on the node D3 to the voltage VDDH in the structure including the capacitor C0 is reduced by a time Δt as compared with that in the assumed structure not including the capacitor C0, so that the rising characteristics of the potential of the node D3 is improved accordingly.

Also in a situation where the signal Din transitions from a high logic level to a low logic level so that the potential of the node D3 changes from the VDDH level to 0V level, the capacitance Cg is small while the potential of the node D3 is ranging from the VDDH level to the Vthn level. This shortens a time for discharge of the node D3. Thus, the existence of the capacitor C0 allows the potential of the node D3 to quickly reach a low logic level, thereby improving the falling characteristics of the potential of the node D3 accordingly.

Further, the capacitor C1 in the level shifter 8 operates in the same manner as the capacitor C0, detailed discussion of which is omitted. In brief, a time for charging or discharging the node D2 is shortened because of the existence of the capacitor C1, which allows for a high-speed operation of the level shifter 8.

Figure 4A:
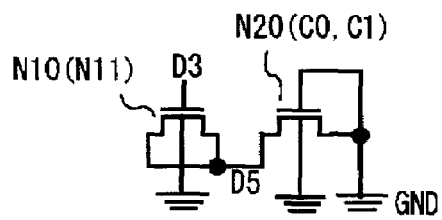
FIGS. 4A and 4B are a circuit diagram and a sectional view, respectively, for specifically showing an exemplary structure of a capacitor C0 or C1.

Each of the capacitors C0 and C1 is formed of a MOS transistor, for example. FIG. 4A is a circuit diagram showing an exemplary structure of the capacitor C0. As shown therein, the capacitor C0 is formed of an NMOS transistor N20 which has a drain connected to the source and the drain of the NMOS transistor N10, and a source and a gate each connected to the ground node D11 and supplied with the ground voltage GND.

Figure 4B:
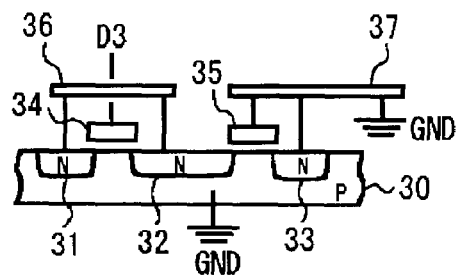

FIG. 4B is a sectional view of the structure of the NMOS transistor N10 and the capacitor C0 of the NMOS transistor N20 shown in FIG. 4A. N-type semiconductor impurity diffusion layers 31, 32 and 33 are formed in a p-type semiconductor substrate 30, being spaced from one another. A polysilicon conductive layer 34 is formed above a portion of the p-type semiconductor substrate 30 which is sandwiched between, and is adjacent to, the diffusion layers 31 and 32. A polysilicon conductive layer 35 is formed above another portion of the p-type semiconductor substrate 30 which is sandwiched between, and is adjacent to, the diffusion layers 32 and 33. The conductive layer 34 is electrically connected to the node D3. Metal interconnect layers 36 and 37 are formed within an interlayer insulating film formed on the substrate 30. The interconnect layer 36 electrically connects the diffusion layers 31 and 32 to each other, while the interconnect layer 37 electrically connects the conductive layer 35 and the diffusion layer 33 to each other. The interconnect layer 37 and the substrate 30 are supplied with the ground voltage GND.

The conductive layer 34 and the diffusion layer 31 function as the gate and the drain of the NMOS transistor 10, respectively. The conductive layer 35 and the diffusion layer 33 function as the gate and the source of the NMOS transistor 20, respectively. The diffusion layer 32 functions as the source of the NMOS transistor N10 which is common with the drain of the NMOS transistor N20. The portion of the p-type semiconductor substrate 30 under the conductive layer 35 which is supplied with the ground voltage GND does not allow formation of an n-type inversion layer therein, so that the transistor N20 is constantly put in an OFF state.

A sum (Cgd+Cb) of a parasitic capacitance between the gate and the drain of the NMOS transistor N20 and a parasitic capacitance between the substrate and the drain of the NMOS transistor N20, which are denoted by reference characters "Cgd" and "Cb", respectively, corresponds to a capacitance value of the capacitor C0. The capacitor C1 is likewise formed of the NMOS transistor N20 shown in FIGS. 4A and 4B, and the NMOS transistor 11 has a structure similar to that of the NMOS transistor N10.

Figure 5A:
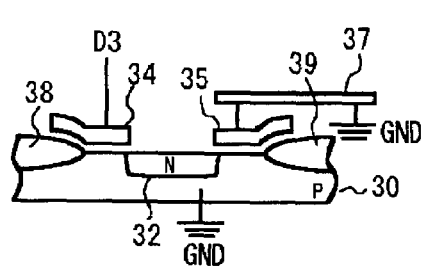
FIGS. 5A to 5D are sectional views specifically showing other exemplary structures of the capacitor C0 or C1.

Alternatively, as occasion calls, either one or both of the diffusion layer 31 and the interconnect layer 36 may be removed. In such a structure: the diffusion layer 32 is formed in a portion of a surface region of the substrate 30 located between an isolation oxide films 38 and 39; the conductive layer 34 is formed on a portion of the p-type semiconductor substrate 30 located between the isolation oxide film 38 and the diffusion layer 32 and on a portion of the isolation oxide film 38; and the conductive layer 35 is formed on another portion of the p-type semiconductor substrate 30 located between the isolation oxide film 39 and the diffusion layer 32 and on a portion of the isolation oxide film 39, as is illustrated in FIG. 5A. A capacitance between the conductive layer 34 and the substrate 30, a capacitance between the conductive layer 34 and the diffusion layer 32, a capacitance between the conductive layer 35 and the diffusion layer 32, and a capacitance between the diffusion layer 32 and the substrate 30 correspond to the capacitances Ci, Cd, Cgd and Cb, respectively, which are referred to in the above discussion.

Figure 5B:
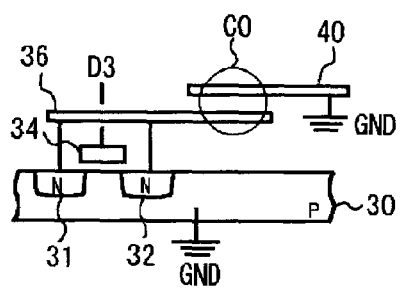

Further alternatively, each of the capacitors C0 and C1 may have a structure shown in FIG. 5B. In accordance with this structure, the capacitor C0 or C1 is formed of the interconnect layer 36 connecting the diffusion layers 31 and 32 and another metal interconnect layer 40 which is formed within the interlayer insulating film so as to be placed opposite to the interconnect layer 36 with a portion of the interlayer insulating film interposed therebetween, and is supplied with the ground voltage GND. With this structure given, the capacitance of each of the capacitors C0 and C1 corresponds to a capacitance between the interconnect layers 36 and 40. The interconnect layer 40 may be formed of a layer placed above the interconnect layer 36 as shown in FIG. 5B, or may alternatively be formed of a layer placed at the same level as the interconnect layer 36 and adjacent to the layer 36, though such is not shown in the drawings.

Figure 5C:
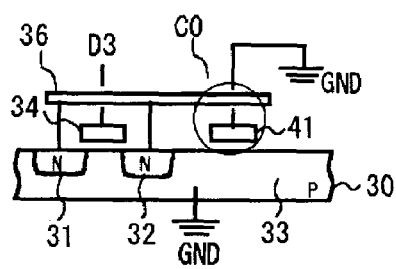

Still further alternatively, each of the capacitors C0 and C1 may have a structure shown in FIG. 5C. In accordance with this structure, each of the capacitors C0 and C1 is formed of the interconnect layer 36 connecting the diffusion layers 31 and 32 and a polysilicon conductive layer 41 which is placed opposite to the interconnect layer 36 with the interlayer insulating film interposed therebetween and is supplied with the ground voltage GND. With this structure given, the capacitance of each of the capacitors C0 and C1 corresponds to a capacitance between the interconnect layer 36 and the conductive layer 41.

Figure 5D:
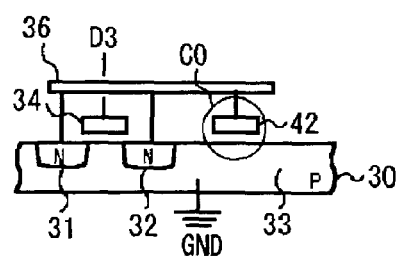

Moreover, each of the capacitors C0 and C1 may be formed of a polysilicon conductive layer 42 which is electrically connected with the diffusion layers 31 and 32 via the interconnect layer 36, and the substrate 30, as shown in FIG. 5D. With this structure given, the capacitance of each of the capacitors C0 and C1 corresponds to a capacitance between the conductive layer 42 and the substrate 30.

As discussed above, in accordance with the first preferred embodiment, a capacitor is connected to a node on which a voltage with the amplitude thereof having been changed is to be present in a level shifter. This makes it possible to set the potential of the node at a predetermined logic level suitable as an initial logic level at the time of power supply. The initial logic level is determined depending on whether the capacitor is connected to a power node or a ground node. In the present preferred embodiment, when the level shifter is used for driving a driver which transmits a signal to another semiconductor device, by appropriately determining the initial logic level of the voltage on the node, a large amount of current is prevented from abruptly flowing through a transistor having a greater driving force forming the driver, at the time of power supply.

Further, a gate of a MOS transistor as the capacitor is connected to the node to be initialized (i.e., the potential of which should be set at the initial logic level), while a source/drain (diffusion layer) of the MOS transistor is connected to another capacitor. This reduces a capacitance of the node to be initialized during a normal operation. As a result, operation speeds of the level shifter and the driver are increased.

<Second Preferred Embodiment>

Figure 6:
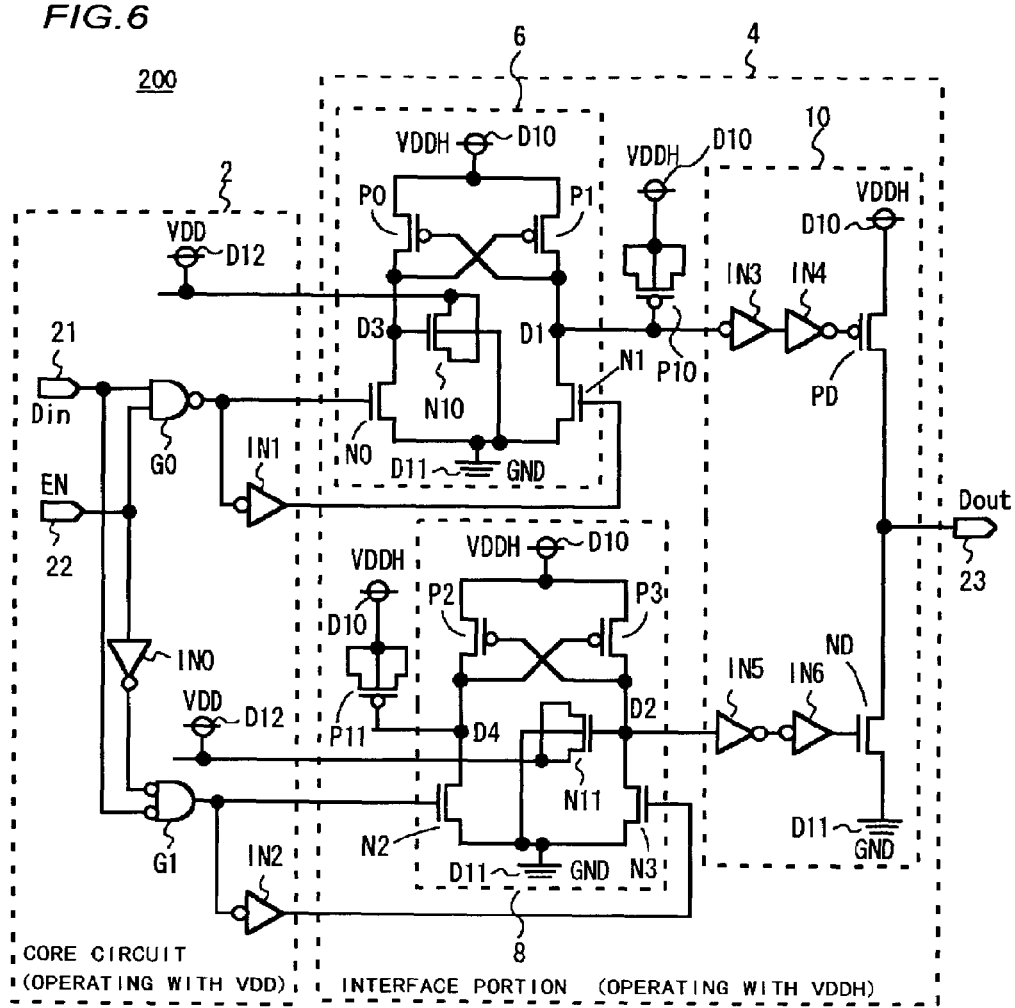
FIG. 6 is a circuit diagram showing a semiconductor integrated circuit device 200 according to a second preferred embodiment of the present invention.

FIG. 6 is a circuit diagram showing a structure of a semiconductor integrated circuit device 200 according to a second preferred embodiment of the present invention. The semiconductor integrated circuit device 200 is substantially identical to the semiconductor integrated circuit device 100 shown in FIG. 1 except that the capacitor C0 and C1 are removed, and each of the sources and the drains of the NMOS transistors N10 and N11 is connected to a power node D12 which is supplied with the operating power used for the core circuit 2 (the power supply voltage VDD).

First, operations in a situation where power is supplied to the interface portion 4 earlier than the core circuit 2 will be discussed. In the level shifter 6, the potential of the node D12 is kept 0V at the time when the potential of the power node D10 is raised to the voltage VDDH level. Accordingly, the gate-substrate capacitance of the NMOS transistor N10 corresponds to the capacitance between the ground node D11 and the node D3, to prevent the potential of the node D3 from being raised. Also, the capacitance of the PMOS transistor P10 corresponds to the capacitance between the node D1 and the power node D10, to raise the potential of the node D1 as the potential of the power node D10 is raised to the level of the power supply voltage VDDH. Thus, the potentials of the nodes D1 and D3 are set at a high logic level corresponding to the level of the power supply voltage VDDH and a low logic level corresponding to the level of the ground voltage GND, respectively, in the same manner as in the device shown in FIG. 1.

Operations in the level shifter 8 are similar to those in the level shifter 6, and the same discussion will not be repeated. In brief, a raise in the potential of the node D2 is prevented while the potential of the node D4 is raised. Thus, the potentials of the nodes D2 and D4 are set at a low logic level corresponding to the level of the ground voltage GND and a high logic level corresponding to the level of the power supply voltage VDDH, respectively. With the potentials of the D1 and D2 being set as such, the node 23 is put in a high-impedance state. On the other hand, in an alternative situation where power is supplied to the core circuit 2 earlier than the interface portion 4, a problem associated with a large amount of current flow through the transistors PD and ND would not be caused for the same reasons described in the first preferred embodiment.

As for operations during a normal operation after power is supplied to both the core circuit 2 and the interface portion 4, discussion will be made only with respect to operations of the NMOS transistors N10 and N11 which are different from those in the structure shown in FIG. 1. In the other respects than the NMOS transistors N10 and N11, both the structure and the operations shown in FIG. 6 are identical to those shown in FIG. 1, and thus explanation thereof is omitted.

The power node D12 is constantly supplied with the power supply voltage VDD, so that each potential of the sources and the drains of the NMOS transistors N10 and N11 is kept at a voltage level higher than the level of the ground voltage GND applied to the respective back gates (substrate) of the transistors. A so-called back-bias effect is produced, and each of the NMOS transistors N10 and N11 has a threshold voltage Vthnx higher than the threshold voltage Vthn which is obtained in a normal state with the source being supplied with the ground voltage GND.

Figure 7:
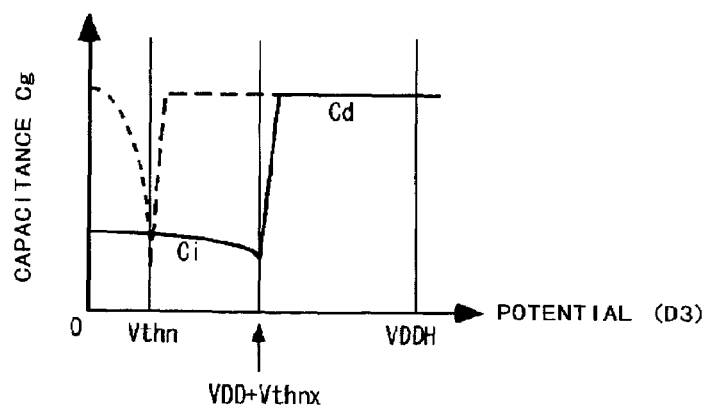
FIG. 7 is a graph illustrating the characteristics of a capacitance of a capacitor connected to a node, a potential of which is set to a predetermined logic level at the time of power supply in a level shifter shown in FIG. 6.

FIG. 7 is a graph showing a relationship between the potential of the node D3 and a capacitance Cg between the nodes D3 and D12 which is obtained by the NMOS transistor N10. In order to have a channel formed in the NMOS transistor N10, it is required that the gate-source voltage thereof is larger than the threshold voltage Vthnx. When the potential of the D3 is set at the level of (VDD+Vthnx) or higher, a channel is formed in the NMOS transistor N10 and the capacitance Cg becomes substantially equal to the gate-source/drain capacitance Cd of the NMOS transistor N10. When the potential of the node D3 is lower than the level of (VDD+Vthnx), no channel is formed and the capacitance Cg becomes substantially equal to the gate-substrate capacitance Ci of the NMOS transistor N10. At that time, a reverse bias voltage is applied across the substrate and the source/drain, which allows a depletion layer to extend more prominently as compared with a situation where the source and the drain are supplied with the ground voltage GND. As a result, the capacitance Ci is significantly small.

FIG. 7 contains a dotted line which denotes an assumed value of the capacitance Cg (hereinafter referred to as an "assumed capacitance Cg") on the assumption that the source and drain of the NMOS transistor N10 are supplied with the ground voltage GND. When the potential of the node D3 is set at the level of 0V, the capacitance Cg in the present preferred embodiment (denoted by a solid line in the graph) is smaller than the assumed capacitance Cg denoted by the dotted line. However, while both the capacitance Cg and the assumed capacitance Cg decrease as the potential of the node D3 increases, the decrease rate of the capacitance Cg is significantly lower than that of the assumed capacitance Cg denoted by the dotted line. Further, the capacitance Cg in the present preferred embodiment continues to decrease after the potential of the node D3 exceeds the level of the threshold voltage Vthn. In contrast, the assumed capacitance Cg denoted by the dotted line stops decreasing at the time when the potential of the node D3 is equal to the level of the threshold voltage Vthn, and then begins to drastically increase to reach the capacitance Cd. The capacitance Cg in the present preferred embodiment stops decreasing and begins to drastically increase to reach the capacitance Cd only after the potential of the D3 exceeds the level of (VDD+Vthnx).

When the signal Din transitions from a low logic level to a high logic level, the potential of the node D3 is changed from the level of 0V to the level of VDDH. However, as appreciated from FIG. 7, the capacitance Cg is significantly small due to the NMOS transistor N10 while the potential of the node D3 is increasing from 0V-level to the level of (VDD+Vthnx), which reduces the time for charging the node D3 accordingly. Further, the change rate of the potential of the node D3 from a low logic level to a high logic level is increased. On the other hand, when the signal Din transitions from a high logic level to a low logic level, the potential of the node D3 is changed from the level of VDDH to 0V-level. Also in this situation, the capacitance Cg is significantly small while the potential of the node D3 is decreasing from the level of (VDD+Vthnx) to 0V-level, which reduces the time for charging the node D3 accordingly. Hence, the change rate of the potential of the node D3 from a high logic level to a low logic level is increased. As the NMOS transistor N11 of the level shifter 8 operates in the same manner as the NMOS transistor N10 of the level shifter 6, detailed discussion of which is omitted.

As discussed above, in accordance with the present preferred embodiment, when power is supplied to the interface portion 4 earlier than the core circuit 2, a capacitor is provided, thereby to keep the potential of a node of a level shifter at a predetermined logic level suitable as an initial logic level. In addition, the rising and falling characteristics of the potentials of the nodes D2 and D3 are improved and the operation speeds of the level shifters 6 and 8 during a normal operation after the power supply are increased. Further, also the operation speed of the driver portion 10 is increased. Moreover, the removal of the capacitors C0 and C1 according to the present preferred embodiment results in reduction in the number of elements for forming the integrated circuit device as compared with the first preferred embodiment.

<Third Preferred Embodiment>

Figure 8:
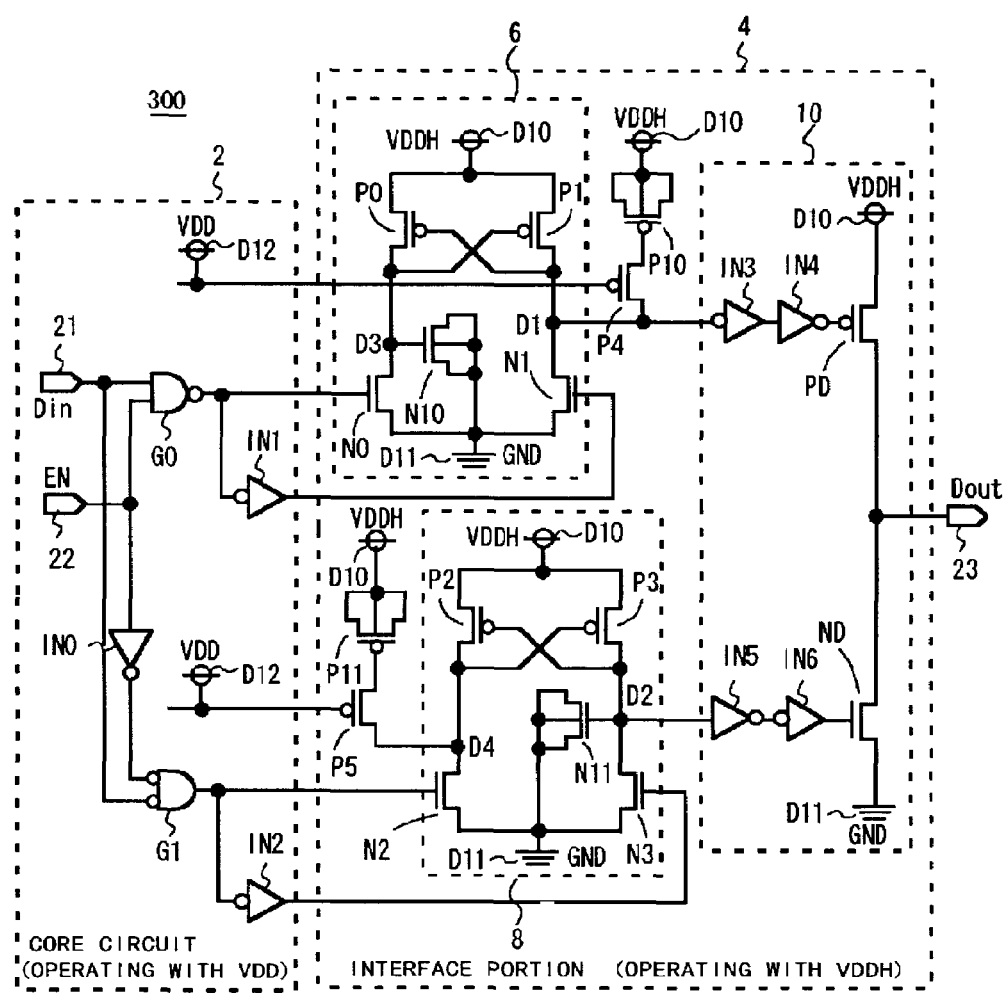
FIG. 8 is a circuit diagram showing a semiconductor integrated circuit device 300 according to a third preferred embodiment of the present invention.

FIG. 8 is a circuit diagram showing a structure of a semiconductor integrated circuit device 300 according to a third preferred embodiment of the present invention. In accordance with the first and second preferred embodiments, a capacitance to be provided to a node, the potential of which should be kept at a low logic level as an initial logic level at the time of power supply is reduced during a normal operation, for achieving increase of the operation speeds of the level shifters. Conversely to this, in accordance with the present preferred embodiment, increase of the operation speeds of the level shifters is achieved by reducing a capacitance to be provided to a node, the potential of which should be kept at a high logic level, during a normal operation.

To this end, a structure of the device according to the present preferred embodiment is different from that shown in FIG. 1 in the following respects. First, the capacitors C0 and C1 are removed. Secondly, each of the sources and the drains of the NMOS transistor N10 and N11 is connected to the ground node D11, to be supplied with the ground voltage GND. Thirdly, an additional PMOS transistor P4 is provided, which is connected between the PMOS transistor P10 and the node D1 and functions as a switching element for controlling conduction between the PMOS transistor P10 and the node D1. Lastly, a further additional PMOS transistor P5 is provided, which is connected between the PMOS transistor P11 and the node D4 and functions as a switching element for controlling conduction between the PMOS transistor P11 and the node D4. The structure shown in FIG. 8 is identical to that shown in FIG. 1 in all the other respects.

The PMOS transistor P4 has a source and a drain, one of which is connected to the node D1 and the other of which is connected to the gate of the PMOS transistor P10. Further, the PMOS transistor P4 has a gate connected to the power node D12 to which the power supply voltage VDD is applied, and has a substrate (not shown) connected to the power node D10. The PMOS transistor P5 has a source and a drain, one of which is connected to the node D4 and the other of which is connected to the gate of the PMOS transistor P11. Further, the PMOS transistor P5 has a gate connected to the power node D12, and has a substrate (not shown) connected to the power node D10.

In a situation where power is supplied to the interface portion 4 earlier than the core circuit 2, the potential of the power node D12 is kept at 0V-level until a power is supplied to the core circuit 2 after supply of power to the interface portion 4 is completed. Accordingly, both the PMOS transistors P4 and P5 are being turned ON at the time of power supply to the interface portion 4. As a result, the PMOS transistors P10 and P11 are electrically connected to the nodes D1 and D4, respectively. The PMOS transistors P10 and P11 function as capacitors connected between the nodes D1 and D10 and between the nodes D4 and D10, respectively, so that the potentials of the nodes D1 and D4 are set at a high logic level corresponding to the level of the power supply voltage VDDH with the same operations as performed in the devices shown in FIGS. 1 and 6 having being followed.

On the other hand, the NMOS transistors N10 and N11 function as capacitors connected between the node D3 and the ground node and between the node D2 and the ground node, respectively. Accordingly, each potential of the nodes D3 and D2 is set at a low logic level corresponding to the level of the ground voltage GND. In an alternative situation where power is supplied to the core circuit 2 earlier than the interface portion 4, a problem associated with a large amount of current flow through the transistors PD and ND would not be caused for the same reasons described in the first preferred embodiment.

As for operations during a normal operation after power is supplied to both the core circuit 2 and the interface portion 4, discussion will be made only with respect to operations of the MOS transistors N10, N11, P4, P5, P10 and P11 which are different from those in FIG. 1. In the other respects than the MOS transistors N10, N11, P4, P5, P10 and P11, both the structure and the operations shown in FIG. 8 are identical to those shown in FIG. 1, and thus a detailed description thereof is omitted.

The power supply voltage VDD is applied to each of the gates of the PMOS transistors P4 and P5, so that each of the PMOS transistors P4 and P5 is degraded in ability of supplying current as compared with an instance where 0V is applied to each of the gates. The PMOS transistors P4 and P5 function as resistors connected between the node D1 and the PMOS transistor P10 and between the node D4 and the PMOS transistor P11, respectively. Due to resistances of those resistors, the capacitances of the PMOS transistors P10 and P11 to be provided to the nodes D1 and D4 are apparently reduced. As a result, the nodes D1 and D4 can be charged or discharged more quickly, which increases the operation speeds of the level shifters 6 and 8. Further, as the rising and falling characteristics of the potentials of the nodes D1 and D2 are improved, also the operation speed of the driver portion 10 which is connected to the nodes D1 and D2 and is provided in a stage subsequent to the level shifters is increased.

Although FIG. 8 shows that each of the sources and the drains of the NMOS transistors N10 and N11 is connected to the ground node D11, a capacitor may alternatively be inserted between each of sources and the drains of the NMOS transistors N10 and N11 and the ground node D11 in the same manner as shown in FIG. 1. This makes it possible to reduce also the capacitances provided to the nodes D3 and D2 as discussed in the first preferred embodiment, thereby further increasing the operation speeds of the level shifters 6 and 8.

Further alternatively, each of the sources and the drains of the NMOS transistors N10 and N11 may be connected to the power node D12, instead of the ground node D11 in the device shown in FIG. 8, in the same manner as shown in FIG. 6. This makes it possible to reduce also the capacitances provided to the nodes D3 and D2, thereby further increasing the operation speeds of the level shifters 6 and 8.

<Fourth Preferred Embodiment>

Figure 9:
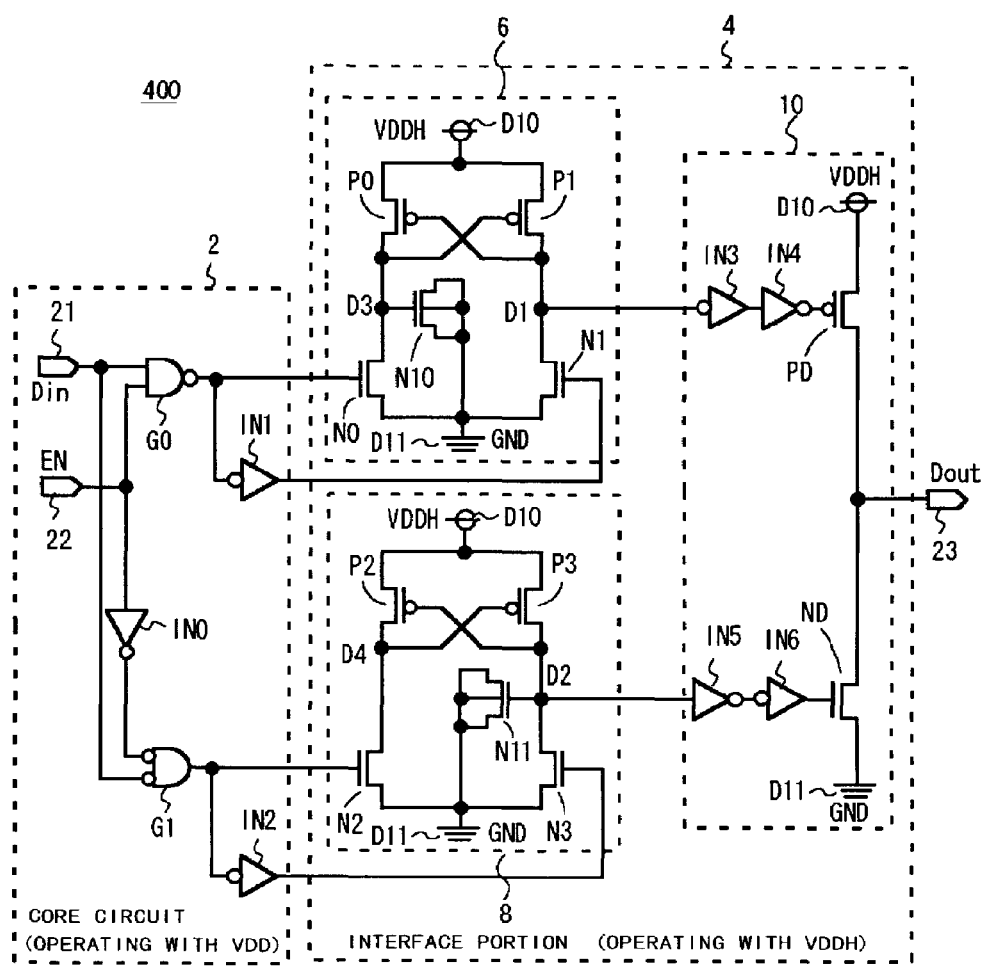
FIG. 9 is a circuit diagram showing a semiconductor integrated circuit device 400 according to a fourth preferred embodiment of the present invention.

FIG. 9 is a circuit diagram showing a structure of a semiconductor integrated circuit device 400 according to a fourth preferred embodiment of the present invention. The present preferred embodiment provides for reduction of the number of elements for forming a structure which allows the potentials of the nodes D1 to D4 of the level shifters to be set at desired voltage levels at the time of power supply to the interface portion 4. To this end, a structure shown in FIG. 9 is different from that shown in FIG. 1 in the following respects. First, the capacitors C0 and C1 are removed. Secondly, each of the sources and the drains of the NMOS transistors N10 and N11 is connected to the ground node D11. Lastly, the PMOS transistors P10 and P11 are removed. The structure shown in FIG. 9 is identical to that in FIG. 1 in all the other respects.

The NMOS transistors N10 and N11 function as capacitors connected between the nodes D3 and D11 and between the nodes D2 and D11, respectively. Each potential of the nodes D1 to D4 and D10 is kept at 0V-level prior to power supply. In a situation where power is supplied to the interface portion 4 earlier than the core circuit 2, the potentials of the nodes D1 to D4 are ready to be raised as the potential of the node D10 is raised from 0V. However, the NMOS transistors N10 and N11 each functioning as a capacitor prevent the potentials of the nodes D3 and D2 from being raised, respectively.

Explanation will be given by taking the level shifter 6 as an example. The capacitance of the transistor N10 is charged up, which keeps the potential of the node D3 equal to the ground voltage GND level. The PMOS transistor P1 is kept turned-ON even after the potential of the node D10 is raised, and the PMOS transistor P1 which is being tuned ON drives the node D1 to raise the potential thereof. This eliminates a need of connecting a capacitor between the node D1 and D10. Also, the PMOS transistor P0 is turned OFF because of the raise in the potential of the node D1, so that no more charge is supplied to the node D3 via the PMOS transistor P0.

As a result of the foregoing operations, the potential of the node D3 is set at a low logic level corresponding to the ground voltage GND level and the potential of the node D1 is set at a high logic level corresponding to the power supply voltage VDDH level. Also, the same operations as explained above are performed in the level shifter 8, where the potentials of the nodes D2 and D4 are set at a low logic level corresponding to the ground voltage GND level and a high logic level corresponding to the power supply voltage VDDH level, respectively. In an alternative situation where power is supplied to the core circuit 2 earlier than the interface portion 4, a problem associated with a large amount of current flow through the transistors PD and ND would not be caused for the same reasons described in the first preferred embodiment.

The node D1 is connected with a logic circuit which performs a predetermined logical operation based on an output from the level shifter 6. More specifically, a gate(s) of either one or a plurality of MOS transistors forming the logic circuit is connected to the node D1. The MOS transistors are connected in series with each other directly, or indirectly, between the power node D10 and the ground node D11, to form a current path between the nodes D10 and D11. Referring to FIG. 9, the inverter IN3 corresponds to the logic circuit, for example. The inverter IN3 includes a PMOS transistor and an NMOS transistor connected in series with each other between the power node D10 and the ground node D11, with respective gates of the PMOS and NMOS transistors being connected to the node D1.

In the present preferred embodiment, elements connected to the node D1 are only the MOS transistors included in the level shifter 6 and the MOS transistor(s) forming the logic circuit provided in a stage subsequent to the level shifter 6. There is no need to provide a capacitor connected between the power node D10 and the node D1 for initializing the node D1 at the time of power supply. The capacitance provided to the node D1 is relatively small in the present preferred embodiment, unlike in the first to third preferred embodiments. Hence, the rising and falling characteristics of the potentials of the nodes D1 and D3 during a normal operation after the time of power supply are improved, thereby increasing the operation speed of the level shifter 6.

Also, elements connected between the power node D10 and the node D4 are only the transistor included in the level shifter 8. There is no need to provide a capacitor connected between the power node D10 and the node D4 for initializing the node D4 at the time of power supply. The capacitance provided to the node D4 is relatively small, which improves the rising and falling characteristics of the potentials of the nodes D2 and D4 during a normal operation after the time of power supply, thereby to increase the operation speed of the level shifter 8. Further, the structure of the present preferred embodiment includes no capacitor connected to the node which should be initialized such that the potential thereof be set at a high logic level at the time of power supply. This reduces the number of elements included in the semiconductor integrated circuit device 400, as well as an area of the device.

Alternatively, each of the sources and the drains of the NMOS transistors N10 and N11 may be connected to the power node of the core circuit 2 to which the power supply voltage VDD is supplied, instead of the ground node D11, in the structure shown in FIG. 9, in the same manner as in FIG. 6. This allows for further increase of the operation speeds of the level shifters 6 and 8.

Further alternatively, the arrangement of the NMOS transistor N10 and the capacitor C0, and the arrangement of the NMOS transistor N11 and the capacitor C1 shown in FIG. 1, may be connected to the nodes D3 and D2, respectively, in the structure shown in FIG. 9. This allows for further increase of the operation speeds of the level shifters 6 and 8.

<Fifth Preferred Embodiment>

Figure 10:
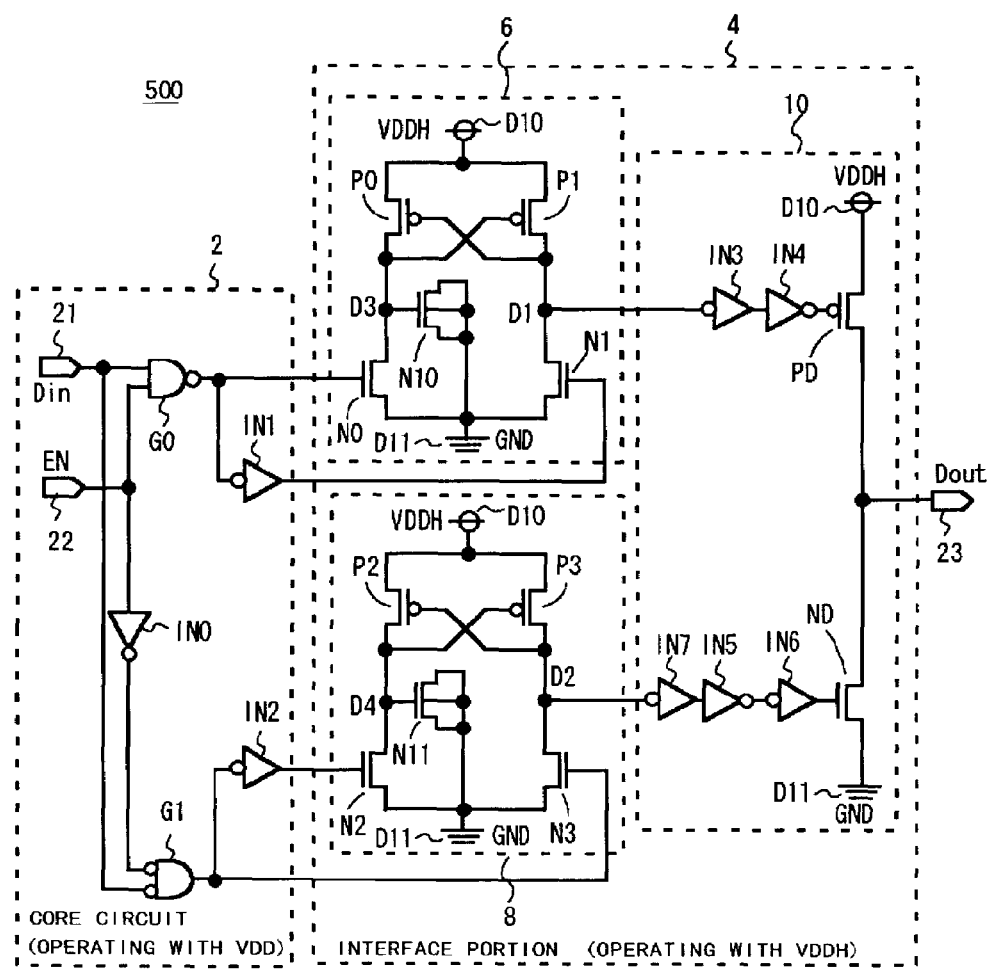
FIG. 10 is a circuit diagram showing a semiconductor integrated circuit device 500 according to a fifth preferred embodiment of the present invention.
Figure 11:
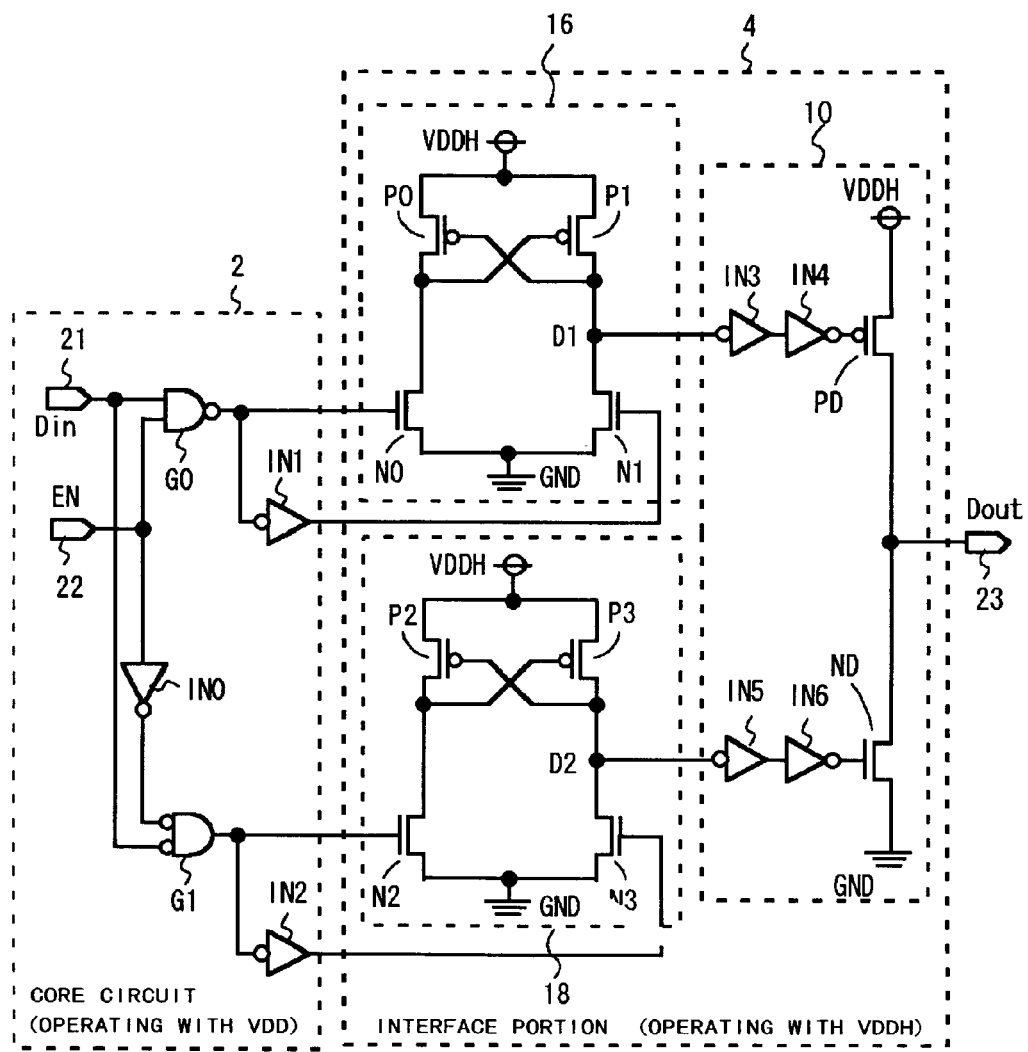
FIG. 11 is a circuit diagram showing a semiconductor integrated circuit device according to the background art.

FIG. 10 is a circuit diagram showing a structure of a semiconductor integrated circuit device 500 according to a fifth preferred embodiment of the present invention. The structure of the device 500 shown in FIG. 10 is different from that shown in FIG. 9 in the following respects. First, the NMOS transistor N11 is connected to the node D4. Secondly, an additional inverter IN7 is provided between the node D2 and the inverter IN5. Lastly, an output of the logic circuit G1 is provided to the gate of the NMOS transistor N3, and an output of the inverter IN2 is provided to the gate of the NMOS transistor N2. The structure shown in FIG. 10 is identical to that shown in FIG. 9 in all the other respects.

In the fourth preferred embodiment including the structure shown in FIG. 9, in a situation where power is supplied to the interface portion 4 earlier than the core circuit 2, the respective potentials V(D) of the nodes D3 and D2 which should be set at a low logic level as an initial logic level are determined so as to satisfy the following equation, to be exact:

$$V(D)=VDDH \cdot Cp/(Cp+Cg)$$

In the above equation, Cg denotes the capacitance between the node D3 or the node D2 and the ground node D11 which is obtained by the NMOS transistor N10 or N11, as described above, while Cp denotes a parasitic capacitance between the node D3 or D2 and the power node D10. The parasitic capacitance contains the gate-source/drain capacitance and a wire capacitance of each of the PMOS transistors P0 to P3. As such, the potentials of the nodes D2 and D3 can not be set precisely at 0V-level, and are tend to be higher than 0V-level depending on the capacitance Cp. A problem is caused in the level shifter 8 particularly when the potential of the node D2 or D3 is equal to the level of several hundreds of mV or higher. In the structure shown in FIG. 9, if the potential of the node D2 reaches the level of several hundreds of mV, leakage current of the inverters IN5 and IN6 provided in a stage subsequent to the level shifter 8 increases. This disadvantageously increases power consumption. Further, if some voltage noise is superposed on the node D2 so that the potential of the node D2 is further raised to exceed the level of a logic threshold voltage of the inverter IN5 in the subsequent stage, the NMOS transistor ND is occasionally turned ON. On the other hand, the nodes D1 and D4, the potentials of which are set at a high logic level as an initial logic level, are supplied with the voltage VDDH to be driven by the PMOS transistors P1 and P2.

In the present preferred embodiment, one of the electrodes of the capacitor (NMOS transistor N11) is connected to the node D4, instead of the node D2. After power is supplied to the interface portion 4 earlier than the core circuit 2, the potential of the node D4 is set at a low logic level due to the capacitance of the NMOS transistor N11, while the potential of the node D2 is set at a high logic level. Particularly, the node D2 is driven by the PMOS transistor P3 and is charged up to the power supply voltage VDDH. In the structure shown in FIG. 10, the potentials of the nodes D2 and D4 are set at respective logic levels in a manner reverse to that in the structure shown in FIG. 9. Accordingly, the inverter IN7 inverts the logic of the node D2, and provides the inverted logic to the inverter IN5. As a result, a level of the logic provided to the inverter IN5 at the time of power supply in the structure of FIG. 10 is identical to that in the structure of FIG. 9, so that the NMOS transistor ND is turned OFF.

As discussed above, in accordance with the present preferred embodiment, the potential of a node of a level shifter, on which node a signal for driving the MOS transistors PD and ND in the driver portion is present, is set at a high logic level using a capacitor (NMOS transistor N11) connected to the ground node, thereby to more stably turn the transistors in the driver OFF. In an alternative situation where power is supplied to the core circuit 2 earlier than the interface portion 4, a problem associated with a large amount of current flow through the transistors PD and ND would not be caused for the same reasons described in the first preferred embodiment.

In addition, in the present preferred embodiment, because of provision of the inverter IN7, the inputs into the gates of the NMOS transistor N2 and N3 are made inverse to those in the structure shown in FIG. 9 during a normal operation after power is supplied to both the core circuit 2 and the interface portion 4, in order to have the device 500 operate logically in the same manner as the device in each of the first to fourth preferred embodiments.

Alternatively, each of the sources and the drains of the NMOS transistors N10 and N11 may be connected to the power node of the core circuit 2 to which the power supply voltage VDD is applied, instead of the ground node D11, in the structure shown in FIG. 10, similarly to the structure shown in FIG. 6. This allows for further increase of the operation speeds of the level shifters 6 and 8.

Further alternatively, the arrangement of the NMOS transistor N10 and the capacitor C0 and the arrangement of the NMOS transistor N11 and the capacitor C1 shown in FIG. 1 may be connected to the nodes D3 and D4 in FIG. 10, respectively. This allows for further increase of the operation speeds of the level shifters 6 and 8. Moreover, capacitors such as the PMOS transistor P10 and P11 shown in FIG. 1, for respectively setting the potentials of the nodes D1 and D2 at a high logic level as an initial logic level may be additionally connected to the nodes D1 and D2, respectively. In such a case, a switching element between the capacitor and each of the nodes D1 and D2 to be initialized may be provided as shown in FIG. 8.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device comprising:
 a level shifter connected to a power node supplied with a power supply voltage and to a ground node supplied with a ground voltage, said level shifter receiving a signal and converting said signal to a different signal having a voltage amplitude greater than that of said signal, to output said different signal to a first node;
 a first capacitor including:
  a conductive portion electrically connected with said first node;
  a first semiconductor portion with an insulating film interposed between said conductive portion and said first semiconductor portion; and
  a second semiconductor portion having a conductivity type different from that of said first semiconductor portion and placed adjacent to said first semiconductor portion; and
 a second capacitor connected in series with said second semiconductor portion of said first capacitor at a second node separated from each of said power node and said ground node.

2. The semiconductor integrated circuit device according to claim 1, wherein
 said first semiconductor portion is electrically connected to said ground node, and
 said second capacitor is connected between said second node and said ground node.

3. The semiconductor integrated circuit device according to claim 1, wherein
said second capacitor includes:
a third semiconductor portion electrically connected to said second semiconductor portion;
a fourth semiconductor portion having a conductivity type different from that of said third semiconductor portion and placed adjacent to said third semiconductor portion; and
a different conductive portion with a different insulating film interposed between said fourth semiconductor portion and said different conductive portion, said different conductive portion being supplied with a voltage which does not cause formation of an inversion layer in said fourth semiconductor portion.

4. The semiconductor integrated circuit device according to claim 1, wherein
said second capacitor includes:
a first metal interconnect layer electrically connected to said second semiconductor portion of said first capacitor; and
a second metal interconnect layer placed opposite to said first metal interconnect layer with an insulating material interposed therebetween.

5. The semiconductor integrated circuit device according to claim 1, wherein
said second capacitor includes:
a metal interconnect layer electrically connected to said second semiconductor portion of said first capacitor; and
a conductive layer containing a material identical to that contained in said conductive portion of said first capacitor, said conductive layer being placed opposite to said metal interconnect layer with an insulating material interposed therebetween.

6. The semiconductor integrated circuit device according to claim 1, wherein
said second capacitor includes:
a conductive layer containing a material identical to that contained in said conductive portion of said first capacitor and electrically connected to said second semiconductor portion of said first capacitor; and
a fifth semiconductor portion placed opposite to said conductive layer with an insulating material interposed therebetween.

7. The semiconductor integrated circuit device according to claim 1, wherein
said second semiconductor portion includes two regions spaced from each other with said first semiconductor portion interposed therebetween, said two regions being electrically connected to each other via an interconnect layer.

8. A semiconductor integrated circuit device comprising:
a core circuit connected to a ground node supplied with a ground voltage and to a first power node supplied with a power supply voltage, said core circuit generating a first signal having a given voltage amplitude;
a level shifter connected to said ground node and to a second power node supplied with a different power supply voltage, said level shifter receiving said first signal and converting said first signal to a second signal having a voltage amplitude greater than that of said first signal, to provide said second signal to a predetermined node; and
a capacitor including:
a conductive portion electrically connected to said predetermined node;
a first semiconductor portion with an insulating film interposed between said first semiconductor portion and said conductive portion; and
a second semiconductor portion having a conductivity type different from that of said first semiconductor portion and placed adjacent to said first semiconductor portion, said second semiconductor portion being electrically connected to said first power node.

9. The semiconductor integrated circuit device according to claim 8, wherein
said first semiconductor portion is electrically connected to said ground node.

10. The semiconductor integrated circuit device according to claim 8, wherein
said second semiconductor portion includes two regions spaced from each other with said first semiconductor portion interposed therebetween, said two regions being electrically connected to each other via an interconnect layer.

11. A semiconductor integrated circuit device comprising:
a level shifter receiving a signal and converting said signal to a different signal having a voltage amplitude greater than that of said signal, to provide said different signal to a first node;
a capacitor including a first electrode and a second electrode connected to a second node; and
a switching element connected between said first and second nodes, for controlling conduction between said first and second nodes,
wherein said first electrode of said capacitor is electrically to a power node supplied with a power supply voltage.

12. The semiconductor integrated circuit device according to claim 11, further comprising
a core circuit connected to a ground node supplied with a ground voltage and to a different power node supplied with a different power supply voltage, said core circuit generating said signal to be received by said level shifter, wherein
said switching element includes a field effect transistor having a gate terminal electrically connected to said different power node.

13. The semiconductor integrated circuit device according to claim 12, wherein
said level shifter is connected to said ground node and to said power node supplied with said power supply voltage.

14. A semiconductor integrated circuit device comprising:
a level shifter connected to a first node supplied with a first voltage and to a second node supplied with a second voltage, said level shifter receiving two input signals logically complimentary to each other and converting said two input signals to two different signals logically complimentary to each other and greater than said two input signals in voltage amplitude thereof, to provide said two different signals to third and fourth nodes, respectively;
a capacitor connected between said first and third nodes; and
at least one field effect transistor electrically connected between said first and second nodes and having a gate electrically connected to one of said third and fourth nodes, wherein
no capacitor for creating a capacitance between said second and fourth nodes is provided.

15. The semiconductor integrated circuit device according to claim 14, wherein
said level shifter includes:
a first field effect transistor of a first conductivity type having a drain connected to said third node, a gate connected to said fourth node and a source connected to said second node;

a second field effect transistor of said first conductivity type having a drain connected to said fourth node, a gate connected to said third node and a source connected to said second node;

a third field effect transistor of a second conductivity type having a drain connected to said third node, a source connected to said first node and a gate receiving one of said two input signals; and a fourth field effect transistor of said second conductivity type having a drain connected to said fourth node, a source connected to said first node and a gate receiving the other of said two input signals.

16. A semiconductor integrated circuit device comprising:

a first level shifter receiving two first signals logically complimentary to each other and converting said two first signals to two different signals greater than said two first signals in voltage amplitude, to provide said two different signals to first and second nodes, respectively;

a second level shifter receiving two second signals logically complimentary to each other and converting said two second signals to two another different signals greater than said two second signals in voltage amplitude thereof, to provide said two another different signals to third and fourth nodes, respectively;

a first capacitor connected between a fifth node supplied with a given voltage and said first node;

a second capacitor connected between said third and fifth nodes;

a first field effect transistor with conduction therein being controlled in accordance with a third signal on said second node; and a second field effect transistor with conduction therein being controlled in accordance with a fourth signal on said fourth node, said second field effect transistor being connected to said first field effect transistor and having a conductivity type different from that of said first field effect transistor.

17. The semiconductor integrated circuit device according to claim 16, wherein said first level shifter includes:

a third field effect transistor of a first conductivity type having a drain connected to said first node and a gate connected to said second node;

a fourth field effect transistor of said first conductivity type having a drain connected to said second node, a gate connected to said first node and a source connected to a source of said third field effect transistor;

a fifth field effect transistor of a second conductivity type having a drain connected to said first node, a gate receiving one of said two first signals and a source connected to said fifth node; and a sixth field effect transistor of said second conductivity type having a drain connected to said second node, a gate receiving the other of said two first signals and a source connected to said fifth node, and said second level shifter includes:

a seventh field effect transistor of said first conductivity type having a drain connected to said third node and a gate connected to said fourth node;

an eighth field effect transistor of said first conductivity type having a drain connected to said fourth node, a gate connected to said third node and a source connected to a source of said seventh field effect transistor;

a ninth field effect transistor of said second conductivity type having a drain connected to said third node, a gate receiving one of said two second signals and a source connected to said fifth node; and a tenth field effect transistor of said second conductivity type having a drain connected to said fourth node, a gate receiving the other of said two second signals and a source connected to said fifth node.

* * * * *